US010011920B2

(12) United States Patent
Hekmatshoar-Tabari et al.

(10) Patent No.: US 10,011,920 B2
(45) Date of Patent: Jul. 3, 2018

(54) LOW-TEMPERATURE SELECTIVE EPITAXIAL GROWTH OF SILICON FOR DEVICE INTEGRATION

(75) Inventors: Bahman Hekmatshoar-Tabari, Mount Kisco, NY (US); Ali Khakifirooz, Mountain View, CA (US); Alexander Reznicek, Mount Kisco, NY (US); Devendra K. Sadana, Pleasantville, NY (US); Ghavam G. Shahidi, Pound Ridge, NY (US); Davood Shahrjerdi, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1141 days.

(21) Appl. No.: 13/032,866

(22) Filed: Feb. 23, 2011

(65) Prior Publication Data
US 2012/0210932 A1    Aug. 23, 2012

(51) Int. Cl.
| C30B 25/04 | (2006.01) |
| C30B 25/10 | (2006.01) |
| C30B 25/14 | (2006.01) |
| C30B 29/06 | (2006.01) |
| C30B 25/18 | (2006.01) |

(Continued)

(52) U.S. Cl.
CPC ............ *C30B 25/04* (2013.01); *C30B 25/105* (2013.01); *C30B 25/14* (2013.01); *C30B 25/183* (2013.01); *C30B 25/186* (2013.01); *C30B 29/06* (2013.01); *C30B 33/12* (2013.01); *H01L 21/0262* (2013.01); *H01L 21/02381* (2013.01); *H01L 21/02395* (2013.01); *H01L 21/02532* (2013.01); *H01L 21/02576* (2013.01); *H01L 21/02584* (2013.01); *H01L 21/02639* (2013.01); *H01L 21/3065* (2013.01)

(58) Field of Classification Search
CPC ...................................................... C30B 25/02
USPC ........................................................ 117/103
See application file for complete search history.

(56) References Cited

U.S. PATENT DOCUMENTS

| 4,473,597 A | 9/1984 | Pankove et al. |
| 4,686,763 A | 8/1987 | Thomas et al. |

(Continued)

FOREIGN PATENT DOCUMENTS

| CN | 1365139 A | 8/2002 |
| JP | 04-333288 A | 11/1992 |

(Continued)

OTHER PUBLICATIONS

Modeling of Carrier Mobility Against Carrier Concentration in Arsenic-, Phosphorus-, and Boron-Doped Silicon, Masetti et al., IEEE . : Tansactions on Electron Devices, vol. ED•30, No. 7, Jul. 1983.*

(Continued)

*Primary Examiner* — Hua Qi
(74) *Attorney, Agent, or Firm* — Tutunjian & Bitetto, P.C.; Louis J. Percello

(57) ABSTRACT

An epitaxy method includes providing an exposed crystalline region of a substrate material. Silicon is epitaxially deposited on the substrate material in a low temperature process wherein a deposition temperature is less than 500 degrees Celsius. A source gas is diluted with a dilution gas with a gas ratio of dilution gas to source gas of less than 1000.

4 Claims, 4 Drawing Sheets

(51) Int. Cl.
*C30B 33/12* (2006.01)
*H01L 21/02* (2006.01)
*H01L 21/3065* (2006.01)

(56) References Cited

U.S. PATENT DOCUMENTS

| | | | |
|---|---|---|---|
| 5,106,767 A | 4/1992 | Comfort et al. | |
| 5,117,271 A | 5/1992 | Comfort et al. | |
| 5,580,381 A | 12/1996 | Yamagata | |
| 5,589,008 A | 12/1996 | Keppner | |
| 5,691,546 A | 11/1997 | Morishita | |
| 5,895,766 A | 4/1999 | Manning | |
| 6,329,698 B1 | 12/2001 | Koscielniak et al. | |
| 6,759,731 B2 | 7/2004 | Chen | |
| 7,160,809 B2 | 1/2007 | Hamers et al. | |
| 7,423,323 B2 | 9/2008 | Chen et al. | |
| 7,468,485 B1 | 12/2008 | Swanson | |
| 7,476,420 B2 | 1/2009 | Skarp et al. | |
| 7,737,357 B2 | 6/2010 | Cousins | |
| 7,816,236 B2 | 10/2010 | Bauer et al. | |
| 8,088,641 B2 | 1/2012 | Mashima et al. | |
| 8,338,211 B2 | 12/2012 | Hwang | |
| 8,664,525 B2 | 3/2014 | Posthuma et al. | |
| 2003/0201517 A1 | 10/2003 | Dunn et al. | |
| 2004/0014307 A1* | 1/2004 | Shin | H01L 21/02063 438/586 |
| 2004/0048454 A1 | 3/2004 | Sakaguchi | |
| 2004/0203176 A1 | 10/2004 | Zhao et al. | |
| 2005/0112874 A1 | 5/2005 | Skarp et al. | |
| 2006/0084243 A1 | 4/2006 | Zhang et al. | |
| 2006/0115934 A1 | 6/2006 | Kim et al. | |
| 2006/0130891 A1 | 6/2006 | Carlson | |
| 2006/0234504 A1* | 10/2006 | Bauer et al. | 438/674 |
| 2007/0042569 A1* | 2/2007 | Dip | H01L 21/32135 438/478 |
| 2007/0169808 A1 | 7/2007 | Kherani et al. | |
| 2007/0235759 A1 | 10/2007 | Henson et al. | |
| 2008/0000521 A1* | 1/2008 | Sivoththaman | C30B 25/02 136/254 |
| 2008/0230116 A1 | 9/2008 | Kannou et al. | |
| 2008/0142843 A1 | 10/2008 | Kang et al. | |
| 2009/0215219 A1 | 8/2009 | Ajiki et al. | |
| 2009/0280584 A1 | 11/2009 | Parekh | |
| 2009/0298269 A1 | 12/2009 | Barwicz et al. | |
| 2009/0314341 A1 | 12/2009 | Borden et al. | |
| 2009/0317934 A1 | 12/2009 | Scherff et al. | |
| 2010/0059109 A1 | 3/2010 | Nakayashiki et al. | |
| 2010/0071767 A1 | 3/2010 | Kato et al. | |
| 2010/0084009 A1 | 4/2010 | Carlson et al. | |
| 2010/0186802 A1 | 7/2010 | Borden | |
| 2011/0041908 A1 | 2/2011 | Harder | |
| 2011/0042744 A1 | 2/2011 | Cheng et al. | |
| 2011/0056551 A1 | 3/2011 | Kim et al. | |
| 2011/0092012 A1 | 4/2011 | Mashima et al. | |
| 2011/0120541 A1 | 5/2011 | Roca I. Cabarrocas et al. | |
| 2011/0132444 A1 | 6/2011 | Meier et al. | |
| 2011/0214719 A1 | 9/2011 | Li et al. | |
| 2011/0240997 A1 | 10/2011 | Rockenberger et al. | |
| 2011/0272012 A1 | 11/2011 | Heng et al. | |
| 2012/0073647 A1 | 3/2012 | Stangl et al. | |
| 2012/0085403 A1 | 4/2012 | Sauar et al. | |
| 2013/0025655 A1 | 1/2013 | Bedell et al. | |
| 2013/0171767 A1 | 7/2013 | Moslehi et al. | |
| 2013/0228221 A1 | 9/2013 | Moslehi et al. | |
| 2014/0000695 A1 | 1/2014 | Stone | |

FOREIGN PATENT DOCUMENTS

| | | |
|---|---|---|
| JP | 2000269140 A | 9/2000 |
| JP | 2002217433 A | 8/2002 |
| JP | 2008311286 A | 12/2008 |
| JP | 2009521801 A | 6/2009 |
| WO | WO2009094578 A2 | 7/2009 |

OTHER PUBLICATIONS

Hekmatshoartabari, B., et al. "Selective Emitter Photovoltaic Device" Non Final Office Action for U.S. Appl. No. 13/749,263 dated Oct. 17, 2013. (17 Pages).

Hekmatshoartabari, B., et al. "Selective Emitter Photovoltaic Device" Non Final Office Action for U.S. Appl. No. 13/706,820 dated Nov. 5, 2013. (18 Pages).

Notice of Allowance and Fees Due dated May 1, 2014 for U.S. Appl. No. 13/749,222.

Final Office Action dated May 16, 2014 for U.S. Appl. No. 13/749,263.

Non-Final Office Action dated Dec. 17, 2013 for U.S. Appl. No. 13/749,222.

U.S. Office Action dated Apr. 22, 2015 in U.S. Appl. No. 13/677,908.

Office Action dated Oct. 23, 2014 for U.S. Appl. No. 13/677,908.

Office Action issued in U.S. Appl. No. 14/711,403 dated Feb. 1, 2017, pp. 1-50.

US Office Action issued in U.S. Appl. No. 13/749,263, dated Aug. 14, 2014, pp. 1-10.

US Office Action issued in U.S. Appl. No. 14/527,274, dated Apr. 9, 2015, pp. 1-8.

US Office Action issued in U.S. Appl. No. 14/711,403, dated Sep. 22, 2017, pp. 1-28.

US Office Action issued in U.S. Appl. No. 15/371,366, dated Oct. 24, 2017, pp. 1-59.

* cited by examiner ably refers to a silicon substrate, but other materials, such as germanium, gallium arsenide, gallium nitride, silicon-germanium, cadmium telluride, zinc selenide, etc., may also be employed -->

LOW-TEMPERATURE SELECTIVE EPITAXIAL GROWTH OF SILICON FOR DEVICE INTEGRATION

BACKGROUND

Technical Field

The present invention relates to semiconductor processing and more particularly to a low temperature epitaxial growth process.

Description of the Related Art

Selective epitaxial growth (SEG) of highly doped silicon is suitable for applications in raised source/drain (S/D) regions to reduce parasitic series resistance associated with shallow-doped S/D regions. However, conventional methods for SEG of silicon require high temperature processing. The typical processing temperatures are greater than 600° C.

The high temperature requirement limits the processes and applications which can utilize the conventional methods for SEG of Si. Further, conventional high temperature depositions (over 600 degrees C.) for epitaxial growth of silicon lack selective growth of Si on predetermined areas, e.g., where the c-Si is exposed.

SUMMARY

An epitaxy method includes providing an exposed crystalline region of a substrate material. Silicon is epitaxially deposited on the substrate material in a low temperature process wherein a deposition temperature is less than 500 degrees Celsius. A source gas is diluted with a dilution gas with a gas ratio of dilution gas to source gas of less than 1000.

Another epitaxy method includes providing a crystalline substrate material; growing an insulator on the substrate material; opening the insulator to form exposed areas of the substrate material; depositing silicon on the exposed areas of the substrate material to form epitaxial silicon on the exposed areas and form non-epitaxial silicon in other than the exposed areas in a low temperature process wherein a deposition temperature is less than 500 degrees Celsius; and etching the non-epitaxial silicon using a plasma to further epitaxial deposition of silicon over the exposed areas.

Yet another epitaxy method includes providing an exposed crystalline region of a substrate material and epitaxially depositing silicon selectively on the substrate material in a low temperature process wherein a deposition temperature is less than 500 degrees Celsius, by diluting a silane with a $H_2$ with a gas ratio of dilution gas to source gas of less than 1000.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
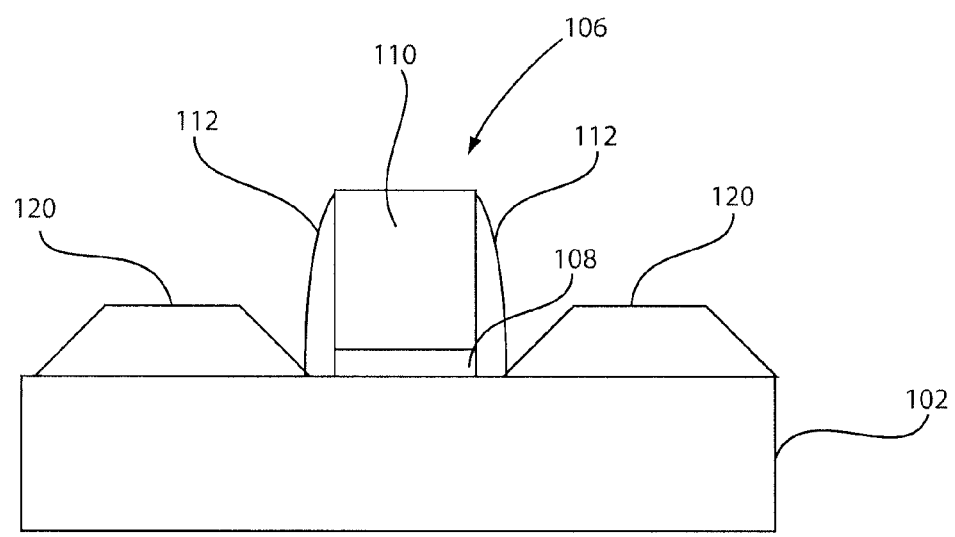
FIG. 1 is a cross-sectional view of an illustrative semiconductor device with raised source/drain regions formed with selective epitaxial growth in accordance with one embodiment.

In accordance with the present principles, methods for selective epitaxial growth of highly-doped silicon at low temperatures are disclosed. In particularly useful embodiments, growth temperatures as low as 150° C. are achieved using plasma enhanced chemical vapor deposition (PECVD). The epitaxial growth is obtained by increasing and optimizing a gas ratio of $[H_2]/[SiH_4]$. In another embodiment, an $N^+$ doped silicon is grown by, e.g., incorporating phosphorus using $PH_3$ gas.

High dopant activation, e.g., greater than $1 \times 10^{20}$ cm$^{-3}$, can be obtained at 150° C. Selective growth is provided by etching a deposited silicon on regions where crystalline-Si (c-Si) is not exposed, in $H_2$ plasma. As a result, the present embodiments offer an uninterrupted selective epitaxial growth (SEG) of Si, where the epitaxial growth and the plasma etching of the non-epitaxial Si occur in a same reactor. Selective epitaxial growth of boron doped Si or other dopants is also possible using the present methods.

The low temperature process in accordance with the present principles opens up possibilities for many applications such as three-dimensional (3D) integration of devices, raised source/drain (S/D) regions for transistors fabricated on extremely thin semiconductor on insulator (ETSOI), partially-depleted SOI (PDSOI), bulk silicon substrates, etc. and other applications.

Plasma enhanced chemical vapor deposition (PECVD) may also be employed for low-temperature deposition of amorphous, microcrystalline, polycrystalline as well as epitaxial growth of silicon on a c-Si substrate at temperatures below 300° C.

The flowchart and diagrams in the Figures illustrate the architecture, functionality, and operation of possible implementations of various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and instructions.

It is to be understood that the present invention will be described in terms of a given illustrative architecture using silicon; however, other architectures, structures, substrate materials and process features and steps may be varied within the scope of the present invention.

Devices described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a device or wafer 100 includes a substrate 102 wherein methods in accordance with the present principles will be applied. Substrate 102 may include, e.g., a bulk monocrystalline silicon substrate, a semiconductor-on-insulator (SOI), an extremely thin SOI (ETSOI) substrate, a partially-depleted SOI (PDSOI) substrate or other substrates. Other substrates may include Ge, III-V substrates (e.g., GaAs), etc. In the present embodiment, silicon is a preferred substrate material for epitaxial growth; however, other crystalline substrate materials may also be employed in accordance with the present principles.

The device 100 may be employed in three-dimensional (3D) integration applications or other applications where epitaxial growth is needed to form component layers. In a particularly useful embodiment, the epitaxial growth is employed to form raised source/drain (S/D) regions for transistors. The present embodiment will illustratively describe forming raised S/D regions although the present principles apply to any epitaxial growth and etching applications.

A gate structure 106 is formed including a gate insulator 108 (e.g., an oxide), a gate conductor 110 (e.g., doped polysilicon), and spacers 112 (e.g., nitride). Other gate structures and materials may also be employed. FIG. 1 illustratively shows faceted S/D regions 120, although the S/D regions 120 need not be faceted. S/D regions 120 are formed by epitaxial growth. The epitaxial growth may include a highly doped or undoped silicon at temperatures as low as 150 degrees C. on predetermined areas of the substrate 102. This is preferably where crystalline silicon (c-Si) is exposed, hence selective epitaxial growth.

In one embodiment, the selective epitaxial growth of silicon is performed in a hydrogen diluted silane environment using a plasma enhanced chemical vapor deposition process (PECVD). The gas ratio of hydrogen gas to silane gas ($[H_2]/[SiH_4]$) at 150 degrees C. is preferably between 0 to about 1000. In particularly useful embodiments, epitaxially growth of silicon begins at a gas ratio of about 5-10. The epitaxial Si quality is improved by increasing the hydrogen dilution, e.g., to 5 or greater.

Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) is preferably performed at deposition temperature ranges from about room temperature to about 500 degrees C., and preferably from about 150 degrees C. to about 250 degrees C. Plasma power density may range from about 2 $mW/cm^2$ to about 2000 $mW/cm^2$. A deposition pressure range may be from about 10 mtorr to about 5 torr.

In one embodiment, high dopant activation can be obtained at temperatures as low as 150 degrees C. This makes the present methods attractive for applications in 3D integration and raised S/D fabrications. The epitaxial Si may contain, e.g., carbon, germanium, phosphorus, arsenic, boron, etc. The low-temperature epitaxial Si may be grown on different substrates, such as Si, Ge, and III-Vs. For example, an epitaxial silicon layer was grown by the present inventors on GaAs at about 200 degrees Celsius in accordance with the present principles.

Figures 2A, 2B:
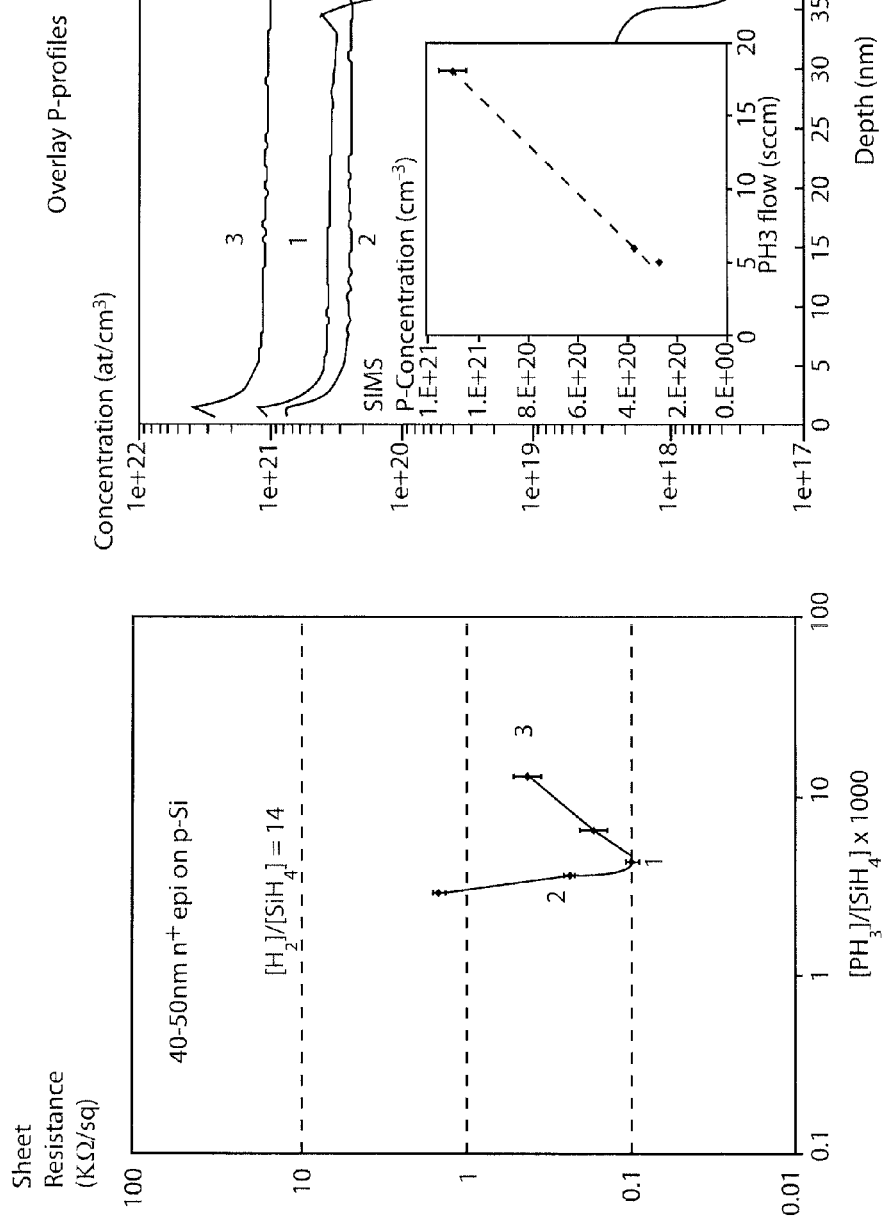
FIG. 2A is a diagram showing sheet resistance versus gas ratio for $[PH_3]/[SiH_4]$ showing three illustrative samples in accordance with one embodiment.
FIG. 2B is a diagram showing atom concentration versus depth for the three samples of FIG. 2A and further showing a linear relationship between P concentration and $PH_3$ flow in accordance with one example.

Referring to FIG. 2A, sheet resistivity of phosphorus doped epitaxial silicon (epi-Si) for various $PH_3$ gas flows is shown. Sheet resistivity for ~40-50 nm thick epi-Si doped for various $PH_3$ gas flows indicates a high dopant activation in silicon. The hydrogen to silane gas ratio was 14. Secondary ion mass spectroscopy (SIMS) was carried out for the samples denoted as 1, 2, and 3.

FIG. 2B shows P concentration (atoms/$cm^3$) versus depth (nm) for samples 1, 2 and 3. The P concentration is linearly proportional with $PH_3$ (see inset 210). A corresponding level of the electrically active dopants from the sheet resistivity measurements for the samples 1 and 2 is in agreement with the actual concentration of dopants given by the SIMS data. The concentration of the electrically active dopants for the sample 3, however, is much lower than the total incorporated dopants, evident from the SIMS analysis of FIG. 2B. The epitaxial growth of silicon was disrupted by increasing the $[PH_3]/[SiH_4]$ for sample 3, and a non-epitaxial phase of silicon began to grow. Similar results were obtained for Boron incorporation. It should be understood that the dopant gas concentration should be maintained below a threshold gas ratio to avoid a non-crystalline silicon phase or to provide a non-epitaxial phase, if desired. With respect to FIG. 2B, the threshold appears to be at about a gas ratio of [PH$_3$]/[SiH$_4$] between about 5-8. Other gases/dopant processes have other thresholds.

Figure 3C:
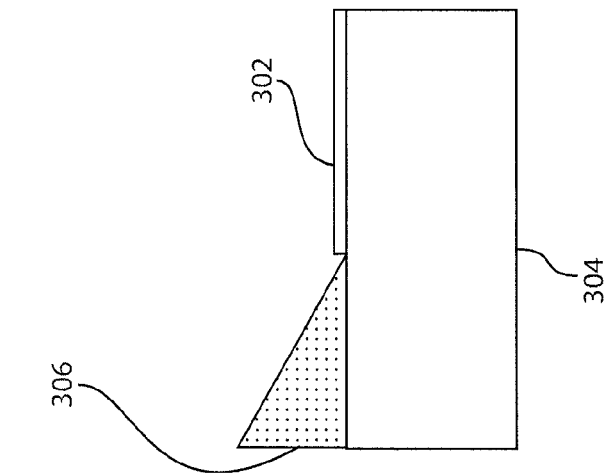
FIG. 3C is a cross-sectional view of the device in FIG. 3B after the non-epitaxial layer has been completely etched in accordance with one embodiment.
Figure 3B:
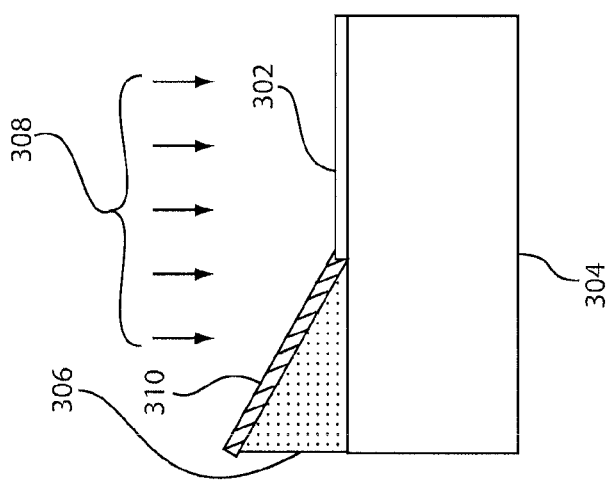
FIG. 3B is a cross-sectional view of the device in FIG. 3A having the non-epitaxial layer etched to further form the selective epitaxial layer in accordance with one embodiment.
Figure 3A:
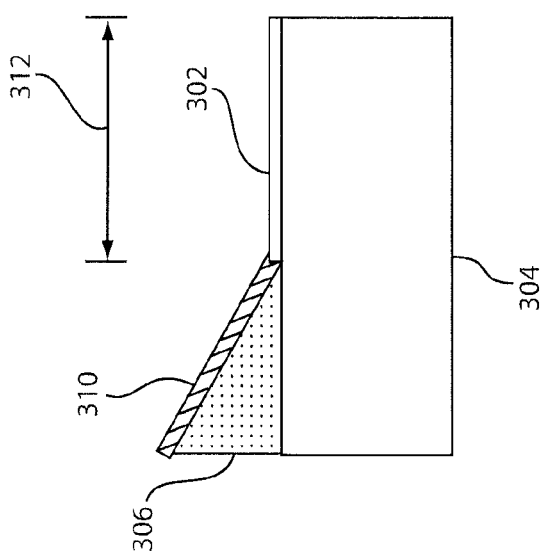
FIG. 3A is a cross-sectional view of a device having a selective epitaxial layer formed along with a non-epitaxial layer in a low temperature process in accordance with one embodiment.

Referring to FIGS. 3A-3C, in another embodiment, selective growth of epitaxial silicon 302 on predetermined areas of a substrate 304 may be obtained by in-situ etching of non-epitaxial silicon in H$_2$ plasma 308. An etching process of amorphous silicon is employed to concurrently form epitaxial silicon on exposed crystalline silicon areas. It should be understood that the epitaxial growth and etching may be performed sequentially or concurrently as needed. In FIG. 3A, a window 312 is opened up within an insulator (e.g., silicon oxide (SiO$_2$)) layer 306, which is formed on substrate 304. Silicon 302 is deposited at, e.g., 500 mTorr, [H$_2$]/[SiH$_4$]=14 and power density of 4 mW/cm$^2$. As a result, the silicon 302 is epitaxial within the window areas 312 where the silicon 302 is exposed to c-Si of the substrate 304. The silicon on the insulator (e.g., oxide) 306 forms as non-epitaxial (e.g., amorphous) silicon 310.

In FIG. 3B, a H$_2$ plasma etch 308 is performed at 150 degrees C. at 900 mtorr, resulting in an etch selectivity of approximately 1:3 for c-Si 304 with respect to a-Si:H 310. FIG. 3C shows the selective epitaxial silicon 302 and the non-epitaxial (amorphous in this case) Si 310 removed. It should be understood that a non-epitaxial portion (amorphous Si 310) grown on the insulator 306 can be etched using gases such as, e.g., H$_2$, HCl, Cl$_2$, Ar, etc. The epitaxial deposition and the H$_2$ plasma etch may be performed sequentially or concurrently in a same chamber. The selective epitaxial growth can be achieved either by alternating gas pulses responsible for the epitaxial growth (e.g., silane and dopant species) and the etch (plasma etchants, e.g., H$_2$, HCl, etc.) or by simultaneous flow of all the gases.

Figure 4:
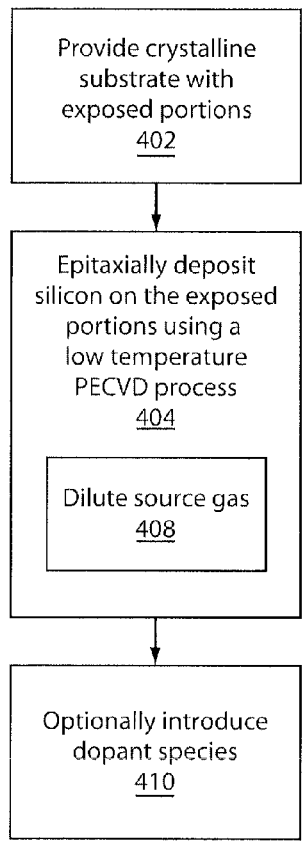
FIG. 4 is a block/flow diagram showing an illustrative method for selective epitaxial growth in accordance with the present principles.

Referring to FIG. 4, a method for selective epitaxial growth is illustratively shown. In block 402, an exposed crystalline region of a substrate material is provided. This may include opening up windows in a dielectric layer or patterning a layer on the substrate. The substrate material may include Si, Ge, III-V materials, etc.

In block 404, silicon is epitaxially deposited on the substrate material in a low temperature process wherein a deposition temperature is less than 500 degrees Celsius, and preferably less than 250 degrees Celsius. The process is selective to exposed areas of the substrate. The process preferably includes a radio frequency or direct current plasma enhanced chemical vapor deposition process.

In block 408, a source gas is diluted with a dilution gas including at least one of H$_2$, HCl, Cl$_2$ and Ar with a gas ratio of dilution gas to source gas of less than 1000. The source gas may include one of SiH$_4$, dichlorosilane (DCS), SiF$_4$ or SiCl$_4$. In a particular useful embodiment, SiH$_4$ is employed with H$_2$ with a gas ratio [H$_2$]/[SiH$_4$] of over 5.

In block 410, a dopant species or multiple dopant species may be introduced with a gas ratio which provides a doped epitaxial silicon. The doped epitaxial silicon may include at least one of carbon, germanium, phosphorus, arsenic or boron.

Figure 5:
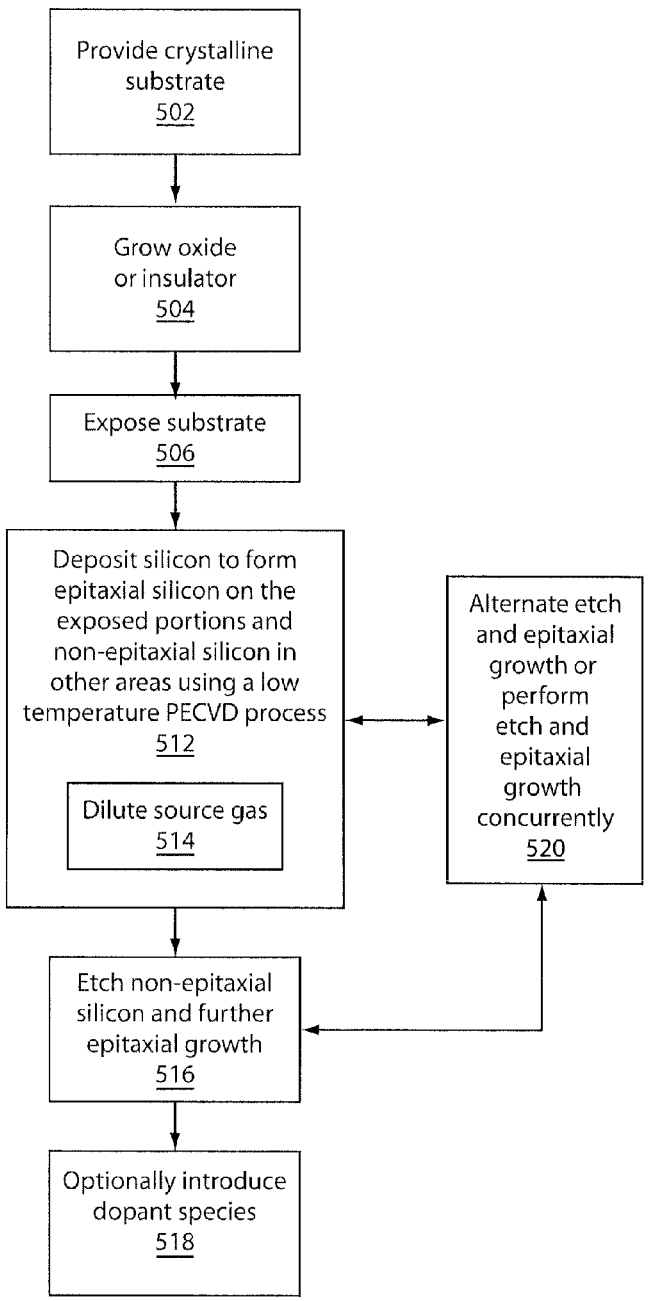
FIG. 5 is a block/flow diagram showing another illustrative method for selective epitaxial growth using etching in accordance with the present principles.

Referring to FIG. 5, another method for selective epitaxial growth is illustratively shown, which employs, e.g., an RF or DC plasma enhanced chemical vapor deposition process. In block 502, a crystalline substrate material is provided. The substrate material may include Si, Ge, III-V materials, etc. In block 504, an oxide or insulator is grown on the substrate material. In block 506, the insulator (e.g., oxide) is opened up or patterned to form exposed areas of the substrate material.

In block 512, silicon is deposited on the exposed areas of the substrate material to form epitaxial silicon on the exposed areas and form non-epitaxial silicon in other than the exposed areas in a low temperature process (e.g., deposition temperature less than 500 degrees Celsius, and more preferably less than 250 degrees Celsius). In block 514, silicon deposition includes diluting a source gas with a dilution gas including at least one of H$_2$, HCl, Cl$_2$ and Ar with a gas ratio of dilution gas to source gas of less than 1000, wherein the source gas includes one of SiH$_4$, dichlorosilane (DCS), SiF$_4$ or SiCl$_4$.

In block 516, the non-epitaxial (e.g., amorphous or polysilicon) silicon is selectively etched using a plasma, and further epitaxial deposition of silicon is performed over the exposed areas. The plasma may include at least one of H$_2$, HCl, Cl$_2$ or Ar.

In block 518, a dopant species or multiple dopant species may be introduced with a gas ratio which provides a doped epitaxial silicon. The doped epitaxial silicon may include at least one of carbon, germanium, phosphorus, arsenic or boron. In block 520, selective epitaxial growth is provided by alternating the depositing and etching steps, or the depositing and etching are concurrently performed.

Having described preferred embodiments for ultra low-temperature selective epitaxial growth of silicon for device integration (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An epitaxy method, comprising:
   providing an exposed crystalline region of a GaAs substrate material;
   epitaxially depositing crystalline silicon directly on the substrate material that is crystalline in a low temperature process wherein a deposition temperature is less than 500 degrees Celsius, the epitaxial depositing crystalline silicon including introducing a phosphorus dopant with a phosphine (PH$_3$) gas ratio to silicon containing gas of SiH$_4$ that ranges from 5 to 8 which provides doped epitaxial crystalline silicon, and
   diluting the silicon containing gas of SiH$_4$, with a gas ratio of the dilution gas of H$_2$ to the silicon containing gas of SiH$_4$ of 5 to 10, wherein said phosphorus dopant is present at a concentration in the crystalline silicon ranging from substantially 1×10$^{20}$ atoms/cm$^{-3}$ to substantially 1×10$^{21}$ atoms/cm$^{-3}$ to provide a sheet resistance ranging from substantially 1 KΩ/sq to 0.1 KΩ/sq, wherein a level of electrically active dopants is equal to said concentration of the phosphorus dopant in the crystalline silicon.

2. The method as recited in claim 1, wherein the epitaxially depositing silicon includes a radio frequency or direct current plasma enhanced chemical vapor deposition process.

3. The method as recited in claim 1, wherein the deposition temperature is less than 250 degrees Celsius.

4. The method as recited in claim 1, wherein the doped epitaxial crystalline silicon includes at least one of carbon, germanium and combinations thereof.

* * * * *